United States Patent [19]

Sone

[11] Patent Number: 4,611,132
[45] Date of Patent: Sep. 9, 1986

[54] CIRCUIT UTILIZING JOSEPHSON EFFECT

[75] Inventor: Junichi Sone, Tokyo, Japan

[73] Assignee: Nippon Electric Co., Ltd., Tokyo, Japan

[21] Appl. No.: 754,209

[22] Filed: Jul. 11, 1985

Related U.S. Application Data

[63] Continuation of Ser. No. 416,424, Sep. 9, 1982, abandoned.

[30] Foreign Application Priority Data

Sep. 14, 1981 [JP] Japan .................... 56-145314

[51] Int. Cl.[4] .................... H03K 19/195
[52] U.S. Cl. .................... 307/462; 307/476; 307/277
[58] Field of Search .............. 301/462, 476, 277, 306; 365/162; 357/5

[56] References Cited

U.S. PATENT DOCUMENTS 4,275,314 6/1981 Fulton .................... 307/277
4,313,066 1/1982 Gheewala .................... 307/462

OTHER PUBLICATIONS

T. R. Gheewala, "Josephson-Logic Devices and Circuits", IEEE Transactions on Electron Devices, vol. ED-27, No. 10, Oct. 1980, pp. 1857–1869.

T. R. Gheewala, "Josephson Logic Circuits Based on Nonlinear Current Injection in Interferometer Devices", Appl. Phys. Lett., vol. 33, No. 8, Oct. 1978, pp. 781–783.

E. P. Harris, "Turn-On Delay of Josephson Interferometer Logic Devices", IEEE Trans. on Magnetics, vol. Mag-15, No. 1, Jan. 1979, pp. 562–565.

Primary Examiner—John Zazworsky
Attorney, Agent, or Firm—Sughrue, Mion, Zinn, Macpeak & Seas

[57] ABSTRACT

A gate circuit includes a first group of N resistors connected together at one end to form a first input terminal for receiving an input current, a second group of N-1 resistors connected in series and connecting the other ends of the first group of resistors, N Josephson junction circuits each connected in series with one of the first group of resistors, a specific Josephson junction circuit coupled between a second input terminal and one end of the series connection of the second group of resistors, and an additional resistor connected between the second input terminal and a reference potential.

13 Claims, 4 Drawing Figures

CIRCUIT UTILIZING JOSEPHSON EFFECT

This is a continuation, of application Ser. No. 416,424, filed 9/9/82, abandoned.

BACKGROUND OF THE INVENTION

The present invention relates to circuits utilizing the Josephson effect and, more particularly, to such a logic gate which has a very short gate delay time and wide operational margins and is feasible for a high degree of integration.

Various kinds of logic gates of the type described have been proposed to take advantage of a low power dissipation and high switching speeds of the Josephson junction. For example, refer to the paper "Josephson-Logic Devices and Circuits", by TUSHAR R. GHEEWALA, IEEE TRANSACTIONS OF ELECTRON DEVICES, vol. ed-27, No. 10, Octber 1980, pp. 1857–1869. These logic gates may generally be classified into two types, the interference type and the current injection type. In the interference type logic gate, a gate current is fed through a loop circuit which is made up of a plurality of Josephson junctions and inductances for electrically coupling the Josephson junctions. The critical value of the gate current is controlled by an input current which is magnetically coupled with the loop circuit, so that the loop circuit is switched from the zero voltage state to the voltage state to inject an output current into an output line which is connected with a gate current path of the loop circuit. An example of such a circuit is described in the paper "Josephson Logic Circuits Based on Nonlinear Current Injection in Interferometer Devices" by T. R. Gheewala, Applied Physics Letter, Vol. 33, No. 8, pp. 781-783. In such interference type logic gates, however, a larger chip area is required to attain the low power dissipation. Because the product of the inductances and the critical currents of the Josephson junctions is limited to a certain value which depends on the magnetic flux quantum $\phi_0$, nevertheless the critical current levels of the Josephson junctions should be small for reduction of the power dissipation. The logic gate contains both the inductance and the Josephson junction capacitance and, therefore, resonance is unavoidable which should be damped for higher switching speeds. Additionally, such a gate tends to trap stray magnetic flux when switched to the superconducting state, resulting in malfunctions.

A current injection type logic gate is proposed in U.S. Pat. No. 4,275,314 which is not provided with any inductance component to overcome the problems discussed above. A switching gate is shown in FIG. 6 of the specification of the U.S. Patent. The switching gate employs the so-called "JAWS (Josephson-AttoWeber Switch)" as its basic construction. First and second Josephson junctions are connected with a first resistor r to form a loop. A third Josephson junction is connected through a second resistor r' to the node between the first and second Josephson junctions. A first bias current $I_b$ is coupled to this node. A load resistor R is connected with the node between the second resistor r' and the third Josephson junction, while a second bias current $I_{b3}$ is coupled to this node. An input current is injected into the node between the second Josephson junction and the first resistor r. This circuit, though favorable from the margins and fanout standpoint, causes some problems. Concerning the resistors R, r and r', there must hold a relation $R \gg r$ in order to prevent backlash of the current when the logic gates are cascaded, and a condition $r \gg r'$ to facilitate transition of the third Josephson junction to the voltage state (to supply a larger amount of current $I_b$ to the third Josephson junction). However, the load resistor R is usually provided with a resistance within the range of about 5-10 Ω in consideration of its impedance matching with the characteristic impedance of a superconducting transmission line fabricated using conventional lithography techniques with minimum feature size of 2-5μ (function of the geometric parameters of the transmission line). Considering, then, the required conditions stated above, at least the resistor r should be selected to have a resistance lying in the range of about 0.5–1Ω and the resistor r' in the range of about 0.05-0.1 Ω. Setting up such a small resistance is quite difficult due to the limitations on production techniques (lithography in particular) and because the effect of the contact resistance can not be neglected. It is, therefore, difficult to accurately control the resistances inasmuch as the distribution of currents coming out from the Josephson junctions must be taken into consideration. Furthermore, the two gate currents required for the logic gate render the design of a power supply system difficult.

SUMMARY OF THE INVENTION

It is an object of the present invention to provide a simple circuit utilizing the Josephson effect which omits an inductance component and eliminates resonance attributable to the Josephson junction capacitance.

It is another object of the present invention to provide a circuit utilizing the Josephson effect which has wide operational margins and high input sensitivity and is capable of high speed switching.

It is another object of the present invention to provide a circuit utilizing the Josephson effect which is feasible for a high degree of integration without significant limitation of the circuit design parameters.

It is another object of the present invention to provide an OR gate utilizing the Josephson effect which features the various advantages described above.

It is another object of the present invention to provide an AND gate utilizing the Josephson effect which features the various advantages described above.

In accordance with one embodiment of the present invention, there is provided a circuit comprising a first group of "N (N≧2)" resistors connected together at one end thereof and each having a predetermined resistance, a second group of "N−1" resistors connected between the other end of the "N" resistors, and each having a predetermined resistance, the second group resistors being connected in series with each other between a first node and a second node, a first group of "N" Josephson junctions connected in parallel with the respective ends of the first group of resistors and each having a predetermined critical current, a first specific Josephson junction connected at one end with said first node and having a predetermined critical current, a first resistor connected in parallel with the other end of the first specific Josephson junction and having a predetermined resistance. This circuit will function as an OR gate if additionally provided with at least one input terminal connected with the node between the first specific Josephson junction and the first resistor and supplied with an input current of a predetermined amplitude, and a gate terminal connected with the one end of the first resistor group and supplied with a gate current of a predetermined amplitude. The same circuit will function as an AND gate if the gate terminal is constructed as the other input terminal and supplied with a second input current.

Other objects and features of the present invention will become apparent from the following description when read with reference to the accompanying drawings.

DETAILED DESCRIPTION OF THE PREFERRED EMBODIMENTS

Figure 1:
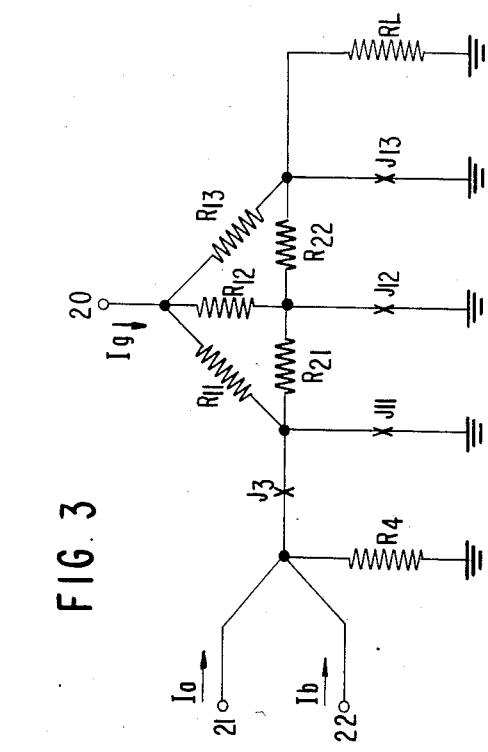
FIG. 1 is a diagram of a logic gate utilizing the Josephson effect embodying the present invention.

Referring to FIG. 1 of the drawings, a current injection type logic gate embodying the present invention is shown which utilizes the Josephson effect. The logic gate includes a Josephson junctions $J_{11}$, $J_{12}$ and $J_3$ having critical currents $I_{11}$, $I_{12}$ and $I_3$, respectively. Resistors $R_{11}$, $R_{12}$, $R_{21}$ and $R_4$ are provided with resistances $r_{11}$, $r_{12}$, $r_{21}$ and $r_4$, respectively. A gate current $I_g$ is supplied to a terminal 10 while input currents $I_a$ and $I_b$ are coupled to terminals 11 and 12, respectively. A load resistor $R_L$ has its resistance $r_L$ selected so that the junctions $J_{11}$, $J_{12}$ and $J_3$ may operate in a latching mode as shown in condition (1) later described.

In operation, the input current $I_a$ or $I_b$ (generally denoted by $I_i$ hereinafter) is injected into the gate through which a gate current $I_g$ is flowing. The input current $I_i$ is steered to ground through the Josephson junctions $J_3$ and $J_{11}$ thereby switching the Josephson junction $J_{11}$ to the voltage state. Then, the current previously flowing through the Josephson junction $J_{11}$ becomes injected partly into the resistor $R_4$ through the Josephson junction $J_3$ and partly into the Josephson junction $J_{12}$ through the resistor $R_{21}$ and resistors $R_{11}$ and $R_{12}$, whereby the Josephson junction $J_{12}$ is switched to the voltage state. The gate current $I_g$ is now partly injected into the load resistor $R_L$ and partly into the resistor $R_4$ through the Josephson junction $J_3$, while the input current $I_i$ is partly injected into the load resistor $R_L$ through the Josephson junction $J_3$ and partly into the resistor $R_4$, switching the Josephson junction $J_3$ to the voltage state. This steers the gate current $I_g$ into the load resistor $R_L$ and the input current $I_i$ into the resistor $R_4$. The whole logic gate is switched in this way and the Josephson junction $J_3$ is brought into its high impedance state, thereby isolating the input and output currents from each other.

In order to permit the logic gate to have wide gate current margins and high inputs sensitivity and to provide sufficient isolation of the input and output currents, it is preferable to employ design conditions described hereunder.

$$r_{11} = r_{12} = r_{21} = \frac{3}{4} r_4 \cong r \tag{1}$$

$$I_{11} = I_{12} = \frac{3}{2} I_3 \cong I_0$$

$$r_L = 10\, r_4$$

-continued $$\frac{I_g}{2} + I_i > I_0 \tag{2}$$

$$I_g > \frac{2}{3} I_0 \tag{3}$$

$$\frac{5}{6} I_g + \frac{2}{3} I_i > I_0 \tag{4}$$

$$\frac{41 I_g - 4 I_i}{46} > \frac{2}{3} I_0 \tag{5}$$

where $I_0$ and $r$ denote critical currents of the junctions $J_{11}$ and $J_{12}$ and the resistance of the resistor $R_{21}$, respectively.

Figure 2:
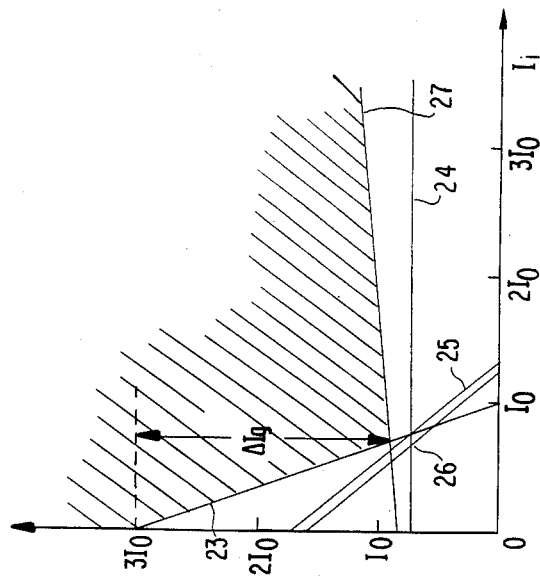
FIG. 2 is a graph showing control characteristics of the logic gate shown in FIG. 1.

Of the relationships (1)–(5), (2) is the condition for the Josephson junction $J_{11}$ to switch to the voltage state, (3) the condition for the Josephson junction $J_{11}$ to switch before the Josephson junction $J_3$, (4) the condition for the Josephson junction $J_{12}$ to switch, and (5) the condition of the Josephson junction $J_3$ to switch. The resulting control characteristics are shown in FIG. 2 in which the hatched area indicates the voltage state of the gate. The reference numerals 13, 14, 15 and 16 in FIG. 2 correspond to the conditions (2), (3), (4) and (5), respectively.

It will be seen from the graph that the logic gate shown in FIG. 1 has an inclination of the line 13 corresponding to the gain (input sensitivity) as high as 2 and gate current margins $\Delta I_g$ as wide as $\pm 43\%$. The absence of inductances makes it possible to produce the logic gate in a small, highly integrated configuration. The absence of resonance, on the other hand, eliminates the need for an additional provision thereagainst. Moreover, since the logic gate is not of the superconducting loop type, it is prevented from trapping stray magnetic flux during the transition to the superconducting state.

Figure 3:
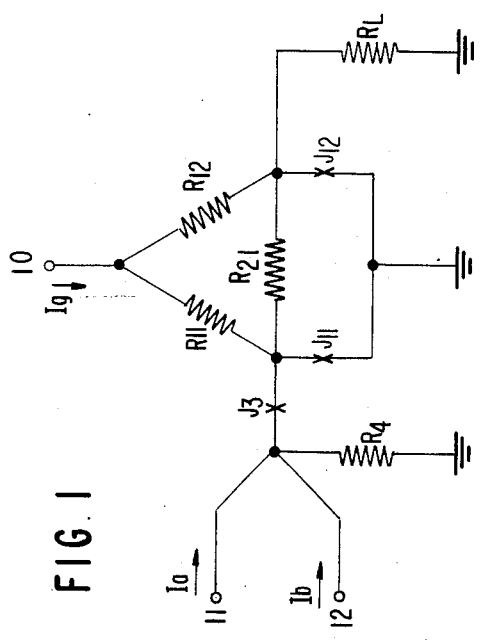
FIG. 3 is a diagram of a logic gate utilizing the Josephson effect according to another embodiment of the present invention.

Referring to FIG. 3, there is shown another embodiment of the present invention which is an extended version of the basic circuit arrangement described with reference to FIG. 1. The alternative logic gate includes Josephson junctions $J_{11}$, $J_{12}$, $J_{13}$ and $J_3$ having critical currents $I_{11}$, $I_{12}$, $I_{13}$ and $I_3$, respectively. Resistors $R_{11}$, $R_{12}$, $R_{13}$, $R_{21}$, $R_{22}$ and $R_4$ are provided which have resistances $r_{11}$, $r_{12}$, $r_{13}$, $r_{21}$, $r_{22}$ and $r_4$, respectively. A gate current is coupled to a terminal 20 while input currents $I_a$ and $I_b$ are coupled individually to terminals 21 and 22. A load resistor $R_L$ has its resistance $r_L$ selected so that the junctions $J_{11}$, $J_{12}$, $J_{13}$ and $J_3$ may operate in latching mode as shown in condition (6) later described. In operation, the input current $I_a$ or $I_b$ (generally denoted by $I_i$ hereinafter) is injected into the gate through which a gate current $I_g$ is flowing. The input current $I_i$ is steered to ground through the Josephson junctions $J_3$ and $J_{11}$ to switch the Josephson junction $J_{11}$ to the voltage state. Then, the current previously flowing through the Josephson junction $J_{11}$ becomes injected partly into the Josephson junction $J_{12}$ through the resistor $R_{21}$ and resistors $R_{11}$ and $R_{12}$, thereby switching the Josephson junction $J_{12}$. Subsequently, the current previously flowing through the Josephson junction $J_{12}$ is partly injected into the Josephson junction $J_{13}$ to cause it to switch. This allows a part of the gate current $I_g$ to reach the load resistor $R_L$ and the rest to reach the resistor $R_4$ through the Josephson junction $J_3$, switching the Josephson junction $J_3$. Eventually, the gate current $I_g$ flows entirely into the load resistor $R_L$ and the input current $I_i$ into the resistor $R_4$ switching the whole logic gate. The high impedance state of the Josephson junction $J_3$ ensures isolation of the input and output currents from each other.

To permit the logic gate shown in FIG. 3 to have wide gate current margins and high input sensitivity and to fully isolate the input and output currents, the various parameters should preferably be selected according to design rules shown below:

$$\left.\begin{array}{l} I_{11} = I_{12} = I_{13} = \frac{10}{7} I_3 \cong I_0 \\ r_{11} = r_{12} = r_{13} \\ r_{21} = r_{22} = 0.4\, r_4 \cong r \\ r_L = 10\, r_4 \\ r_{11}, r_{12}, r_{13} \gg r_{21}, r_{22} \end{array}\right\} \quad (6)$$

$$\frac{I_g}{3} + I_i > I_0 \quad (7)$$

$$I_g > \frac{3}{4} I_0 \quad (8)$$

$$\frac{23}{39} I_g + \frac{10}{13} I_i > I_0 \quad (9)$$

$$\frac{13}{16} I_g + \frac{10}{16} I_i > I_0 \quad (10)$$

$$\frac{10.4\, I_g - I_i}{11.8} > 0.7\, I_0 \quad (11)$$

where $I_0$ and $r$ denote critical currents of the junctions $J_{11}$, $J_{12}$ and $J_{13}$ and the resistances of the resistors $R_{21}$ and $R_{22}$, respectively.

Figure 4:
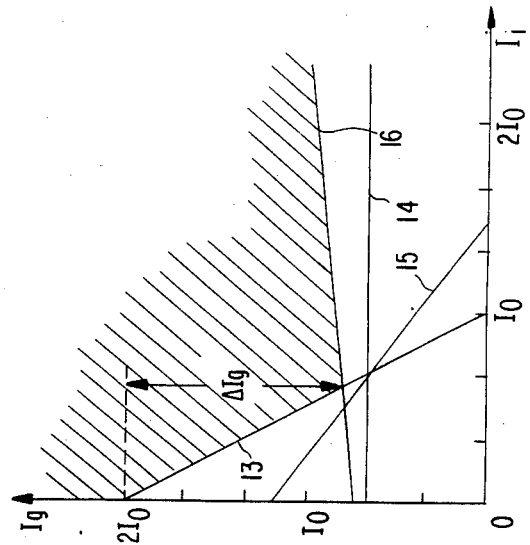
FIG. 4 is a graph showing control characteristics of the logic gate indicated in FIG. 3.

Of the above relationships, (7) is the condition for the Josephson junction $J_{11}$ to switch, (8) the condition for the Josephson junction $J_{11}$ to switch before the Josephson junction $J_3$, while (9)–(11) are the conditions for the Josephson junctions $J_{12}$, $J_{13}$ and $J_3$ to switch, respectively. FIG. 4 is a graph showing the control characteristics thus achieved with the circuitry of FIG. 3. The hatched area in FIG. 4 indicates the voltage state of the gate. Lines 23, 24, 25, 26 and 27 in FIG. 4 correspond to the conditions (7), (8), (9), (10) and (11), respectively.

It will be clear from the graph of FIG. 4 that the alternative logic gate achieves an inclination of the line 23 corresponding to the gain (input sensitivity) as large as 3 and gate current margins $\Delta I_g$ as wide as $\pm 54\%$. The operational margins and, therefore, the gain are even higher than those achievable with the logic gate of FIG. 1. As also understood from the equations (1) and (6), the present invention readily attains wide margins and high input sensitivity without being restricted by resistance and, therefore, it is advantageous for a high degree of integration. In more detail, the resistors $R_{21}$, $R_{22}$ and $R_4$ can be of resistance of substantially the same order of magnitude. Therefore, in consideration of the condition that those resistors should be sufficiently smaller in resistance than the load resistor $R_L$ selected in accordance with impedance matching condition with the transmission line, the smallest resistance can be set at about 1 $\Omega$. This is very advantageous for the construction of an integrated circuit, especially from the point of control capability of the resistance. The upper limit of the load resistance depends on the impedance matching with the transmission line. Although a narrow-width transmission line should be formed to attain the high resistance, obtainable line width is restricted by the lithographic technology. Actually, the highest resistance may be on the order of 30 $\Omega$. The lower limit of each resistance depends on the contact resistance ($\approx 0.1$ $\Omega$). It follows that the smallest resistance used in the gate except the load resistance may be selected from a range of about 0.1 $\Omega$ – 3 $\Omega$.

It will now be apparent from the description of the control characteristics shown in FIGS. 2 and 4 that the present invention becomes more advantageous concerning the margins and input sensitivity as the number of resistors branching off the gate current terminal or the number of Josephson junctions associated therewith increase. Though the number of branches is two in the embodiment of FIG. 1 and three in the embodiment of FIG. 3, it will be clear that four or more branches can be employed for specific applications.

While the embodiment shown in FIG. 1 and 3 is provided with two input lines and one output line, any desired numbers of input and output lines may be installed each in a parallel relationship. The logic gate shown in FIG. 1 or 3 can be used as an AND gate by constructing the gate terminal 10 or 20 as one input terminal and combining the input terminals 11 and 12 or 21 and 22 to form the other input terminal. For such an application, accurate operations should be ensured preferably by positioning a delay circuit (not shown) to precede the input terminals 11 and 12 or 21 and 22.

What is claimed is:

1. A circuit utilizing Josephson junctions of the type having first and second ends and having a low impedance between said first and second ends in a zero voltage state and a high impedance between said first and second ends in a voltage state and changing from said zero voltage state to said voltage state in response to a current flowing between said first and second ends which is greater than a respective critical current, said circuit comprising a first group of "N" (N≧2) resistors connected together at one end thereof and each having a predetermined resistance, a second group of "N−1" resistors each being connected between the other ends of two of said "N" resistors and having a predetermined resistance, said second group of resistors being connected in series between a first node and a second node, one end of the series connection of said second group of resistors being directly connected to said first node and the other end of said series connection of said second group of resistors being directly connected to said second node, a first group of "N" Josephson junctions each connected between a reference potential and a respective one of said other ends of said first group resistors and each having a predetermined critical current, each of said Josephson junctions in said first group of "N" Josephson junctions being connected to one of the other ends of the first group of resistors independently of said second group of resistors, a first additional Josephson junction having first and second ends and connected at said first end thereof with said first node and having a predetermined critical current, and a first additional resistor connected between said reference potential and said second end of said first additional Josephson junction and having a predetermined resistance.

2. A circuit as claimed in claim 1, further comprising a second additional resistor connectd with said second node and having a predetermined resistance.

3. A circuit as claimed in claim 1, in which the smallest resistance used in said circuit is not less than about 0.1 $\Omega$ but not more than 3 $\Omega$.

4. A circuit as claimed in claim 2, further comprising at least one input terminal connected with the node between said first additional Josephson junction and said first additional resistor and supplied with an input current having a predetermined amplitude, and a gate terminal connected with said one end of said first group of resistors and supplied with a gate current having a predetermined amplitude, said circuit having an OR function which produces an output from said second node when said input current is supplied to at least one of said input terminals.

5. A circuit as claimed in claim 2, further comprising a first input terminal connected with the node between said first additional Josephson junction and said first additional resistor and supplied with a first input current having a predetermined amplitude, and a second input terminal connected with said one end of said first group of resistors and supplied with a second input current having a predetermined amplitude, said circuit having an AND function which produces an output from said second node when said first and second input currents are supplied to said first and second input terminals, respectively.

6. A circuit as claimed in any one of claims 1–5, in which "N" is 2.

7. A circuit as claimed in any one of claims 1–5, in which "N" is 3.

8. A circuit as claimed in claim 4, in which "N" is 2 and said circuit satisifes conditions:

$$r_{11} = r_{12} = r_{21} = \frac{3}{4} r_4 \cong r$$

$$I_{11} = I_{12} = \frac{3}{2} I_3 \cong I_0$$

$$r_L = 10 \, r_4$$

$$\frac{I_g}{2} + I_i > I_0$$

$$I_g > \frac{2}{3} I_0$$

$$\frac{6}{5} I_g + \frac{2}{3} I_i > I_0$$

$$\frac{41 \, I_g - 4 \, I_i}{46} > \frac{2}{3} I_0$$

where r is a predetermined resistance value, $I_0$ is a predetermined current value, $r_{11}$ and $r_{12}$ are the resistances of said first group of resistors counting from said first node side, $r_{21}$ is the resistance of said second group of resistors, $I_{11}$ and $I_{12}$ are critical current values of said first group of Josephson junctions counting from said first node side, $I_3$ is the critical current of said first additional Josephson junction, $r_4$ is the resistance of said first additional resistor, $r_L$ is the resistance of said second additional resistor, and $I_i$ and $I_g$ are the amplitudes of said input current and gate current, respectively.

9. A circuit as claimed in claim 5, in which "N" is 2 and the circuit satisfies conditions:

$$r_{11} = r_{12} = r_{21} = \frac{3}{4} r_4 \cong r$$

$$I_{11} = I_{12} = \frac{3}{2} I_3 \cong I_0$$

$$r_L = 10 \, r_4$$

-continued $$I_{i2}/2 + I_{i1} > I_0$$

$$I_{i2} > \frac{2}{3} I_0$$

$$\frac{5}{6} I_{i2} + \frac{2}{3} I_{i1} > I_0$$

$$\frac{41 \, I_{i2} - 4 \, I_{i1}}{46} > \frac{2}{3} I_0$$

where r is a predetermined resistance value, $I_0$ is a predetermined current value, $r_{11}$ and $r_{12}$ are the resistances of said first group of resistors counting from said first node side, $r_{21}$ is the resistance of said second group of resistors, $I_{11}$ and $I_{12}$ are critical current values of said first group of Josephson junctions counting from said first node side, $I_3$ is the critical current of said first additional Josephson junction, $r_4$ is the resistance of said first additional resistor, $r_L$ is the resistance of said second additional resistor, and $I_{i1}$ and $I_{i2}$ are said first and second input currents, respectively.

10. A circuit as claimed in claim 4, in which "N" is 3 and the circuit satisfies conditions:

$$I_{11} = I_{12} = I_{13} = \frac{10}{7} I_3 \cong I_0$$

$$r_{11} = r_{12} = r_{13}$$

$$r_{21} = r_{22} = 0.4 \, r_4 \cong r$$

$$r_L = 10 \, r_4$$

$$r_{11}, r_{12}, r_{13} \gg r_{21}, r_{22}$$

$$\frac{I_g}{3} + I_i > I_0$$

$$I_g > \frac{3}{4} I_0$$

$$\frac{23}{39} I_g + \frac{10}{13} I_i > I_0$$

$$\frac{13}{16} I_g + \frac{10}{16} I_i > I_0$$

$$\frac{10.4 \, I_g - I_i}{11.8} > 0.7 \, I_0$$

where r is a predetermined current value, $r_{11}$, $r_{12}$, $r_{13}$ and $r_{21}$, $r_{22}$ are the resistances of said first and second groups of resistors, respectively, counting from said first node side, $I_0$ is a predetermined current value, $I_{11}$, $I_{12}$ and $I_{13}$ are the critical currents of said first group of Josephson junction, counting from said first node side, $I_3$ is the critical current of said first additional Josephson junction, $r_4$ is the resistance of said first additional resistor, $r_L$ is the resistance of said second additional resistor, and $I_i$ and $I_g$ are the amplitudes of said input current and gate current, respectively.

11. A circuit as claimed in claim 5, in which "N" is 3 and the circuit satisfies conditions:

$$I_{11} = I_{12} = I_{13} = \frac{10}{7} I_3 \cong I_0$$

$$r_{11} = r_{12} = r_{13}$$

$$r_{21} = r_{22} = 0.4 \, r_4 \cong r$$

$$r_L = 10 \, r_4$$

-continued $$r_{11}, r_{12}, r_{13} \gg r_{21}, r_{22}$$

$$\frac{I_{i2}}{3} + I_{i1} > I_0$$

$$I_{i2} > \frac{3}{4} I_0$$

$$\frac{23}{39} I_{i2} + \frac{10}{13} I_{i1} > I_0$$

$$\frac{13}{16} I_{i2} + \frac{10}{16} I_{i1} > I_0$$

$$\frac{10.4 I_{i2} - I_{i1}}{11.8} > 0.7 I_0$$

where r is a predetermined resistance, $r_{11}$, $r_{12}$, $r_{13}$ and $r_{21}$, $r_{22}$ are the resistances of said first and second groups of resistors counting from said first node side, respectively, $I_0$ is a predetermined current value, $I_{11}$, $I_{12}$ and $I_{13}$ are the critical current values of said first group of Josephson junctions counting from said first node side, $I_3$ is the critical current of said first additional Josephson junction, $r_4$ is the resistance of said first additional resistor, $r_L$ is the resistance of said second additional resistor, and $I_{i1}$ and $I_{i2}$ are said first and second input currents, respectively.

12. A circuit as claimed in claim 1, wherein said one end of said series connection of said second group of resistors is always at the same potential as said first node, and wherein said other end of said series connection of said second group of resistors is always at the same potential as said second node.

13. A circuit as claimed in claim 1, wherein $N > 2$.

* * * * *